United States Patent [19]

Scifres et al.

[11] Patent Number: 4,555,785
[45] Date of Patent: Nov. 26, 1985

[54] OPTICAL REPEATER INTEGRATED LASERS

[75] Inventors: Donald R. Scifres, Los Altos; William Streifer, Palo Alto; Robert D. Burnham, Los Altos Hills, all of Calif.

[73] Assignee: Xerox Corporation, Stamford, Conn.

[21] Appl. No.: 589,796

[22] Filed: Mar. 15, 1984

Related U.S. Application Data

[62] Division of Ser. No. 336,750, Jan. 4, 1982, Pat. No. 4,450,567, which is a division of Ser. No. 56,765, Jul. 12, 1979, Pat. No. 4,316,156.

[51] Int. Cl.$^4$ ................................................. H01S 3/19
[52] U.S. Cl. .......................................... 372/8; 372/50
[58] Field of Search ................... 372/8, 44, 50; 357/17

[56] References Cited

U.S. PATENT DOCUMENTS 3,431,437  3/1969  Kosanocky ............................. 372/8
4,065,729  12/1977  Gover et al. .......................... 372/50

OTHER PUBLICATIONS

Lockwood et al., "The GaAs P-N-P-N Laser Diode", *IEEE Journal of Quantum Electronics*, vol. QE-10, No. 7, Jul. 1974, pp. 567–569.

*Primary Examiner*—James W. Davie
*Attorney, Agent, or Firm*—Franklyn C. Weiss

[57] ABSTRACT

Integrated laser diode devices are utilized as repeater elements and logic circuit elements in fiber optic and other light transfer systems. One embodiment discloses a six layer device (10) which is triggered not by an external electrical gating source, but by an external light source (8, 9) as from an optical fiber. Another embodiment operates a laser diode in a bilateral mode. That is, depending on the polarity of the applied voltage bias V to the device (50), two separate light pulses are emitted from different regions (56, 52) of the crystal. A further embodiment utilizes the semiconductor laser as a logical AND function. When the electrical bias (V) of the device (60) is set so that when at least two external light sources (67, 68) are applied, the device will emit laser light (69). Still another embodiment utilizes two semiconductor laser devices (911, 913) as an astable optical multivibrator (90).

4 Claims, 9 Drawing Figures

OPTICAL REPEATER INTEGRATED LASERS

This is a division of application Ser. No. 336,750 filed Jan. 4, 1982, U.S. Pat. No. 4,450,567 which is a division of application Ser. No. 056,765 filed July 12, 1979, U.S. Pat. No. 4,316,156.

The invention relates to optical repeater integrated lasers; integrated laser diode devices are utilized as repeater elements and logic circuit elements in fiber optic or other light transfer systems.

BACKGROUND OF THE INVENTION

Semiconductor diode lasers were developed in 1962 almost simultaneously by several groups of workers. Since then much development work has evolved in the development and use of light emitting semiconductor diodes.

There are at least three groups of diode lasers and are classified according to structure. Simple diode lasers are called homostructure lasers because they are made of a single semiconductor material. A homostructure diode laser would comprise, for example, n-type and p-type gallium arsenide (GaAs). The recombination of electrons injected from the n-region into the p-region with holes existing in the p-region causes the emission of laser light.

In a single-heterostructure semiconductor laser device on additional layer of aluminum gallium arsenide, (AlGaAs), for example, is added. This type of crystal has had some of the gallium atoms in the gallium arsenide crystal replaced by aluminum atoms. The injected electrons are stopped at the aluminum gallium arsenide layer (junction) resulting in a higher degree of concentration of light emitted.

In a double-heterostructure semiconductor laser device, for example, a layer of GaAs is sandwiched between two layers of AlGaAs. The barriers set up by the heterostructures cause even further confinement of the light emitted.

SUMMARY OF THE INVENTION

According to the present invention, several embodiments of semiconductor laser devices, in the double-heterostructure class, are disclosed. One embodiment discloses a six layer p-n-p-n-n-n device which is triggered not by an external electrical gating source, but by an external light source as from an optical fiber. The application of the input light source results in a large output light source, so as to function as an optical repeater.

Another embodiment of the present invention discloses the optical repeater aspect thereof but now it can be operated in a bilateral mode. That is, depending on the polarity of the applied voltage bias to the device, two separate light pulses are emitted from different regions of the crystal. It, therefore, is also selectively responsive to different impinging light sources.

A further embodiment of the optical repeater of the present invention discloses the use of the semiconductor diode laser as a logical AND function. That is, the electrical bias of the device is set so that when at least two external light sources are applied, the device will emit laser light. Both external sources must be on at the same time to allow the device to lase. Since one or the other input separately will not trigger the device, but both sources will, the optical repeater operates in a logical AND fashion.

Still another embodiment of the present invention utilizes the teachings of the optical repeater of the present disclosure to generate two optical pulse trains which alternate in an adjustable repetition frequency. Thus, the circuit will operate in an astable optical multiviberator mode.

DESCRIPTION OF THE DRAWINGS

For a more complete understanding of the invention, reference may be had to the following detailed description of the invention in conjunction with the drawings wherein.

DETAILED DESCRIPTION OF THE INVENTION

In an article by H. F. Lockwood et al, "The GaAs P-N-P-N Laser Diode", IEEE J. Quantum Electronics, Vol. QE10, No. 7, July 1974, pp. 567–569, a p-n-p-n laser diode is described. It is disclosed therein that the laser diode was capable of emitting 0.5 watt pulses of approximately 5 nanoseconds in duration. It was triggered not by an external gating source as is usually the case in p-n-p-n switches, but rather by increasing the voltage across the entire device until avalanche breakdown was reached in the reverse biased junction. At this point a capacitor across the device discharged and a short high power light pulse was emitted. See also U.S. Pat. No. 4,065,729 to Gover et al, issued Dec. 27, 1977, wherein a p-p-p-n-p-n-n-n laser diode is described which produces coherent laser beams in response to received light pulses.

In one embodiment of the present invention, there is described an alternative way to configure this type of p-n-p-n laser so that light (as from an optical fiber, for example) can be used to trigger the laser. In this configuration, a small input light pulse will result in a large output light pulse whose pulse shape is independent of the input light pulse shape.

Figure 1:
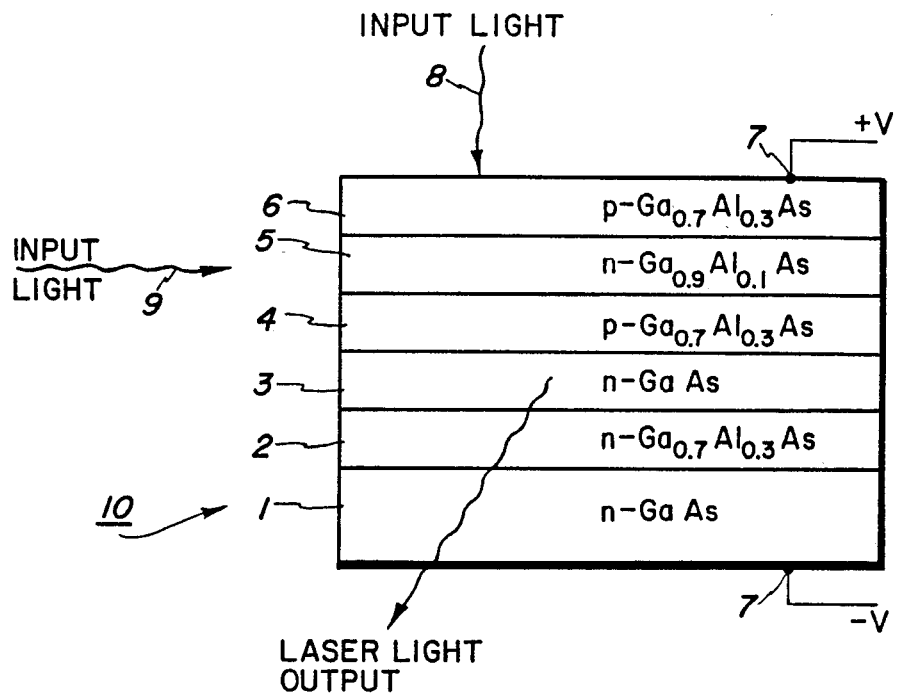
FIGS. 1 to 4 show schematic representations of alternate features of one embodiment of the present invention.

One such device is shown in FIG. 1. It consists of a p-n-p-n structure 10 configured as a p-n-p-n-n-n device as follows. Layer 1 is an n-type GaAs substrate upon which the other layers are grown. Layer 2 is n-type $Ga_{0.7}Al_{0.3}As$. Layer 3 is the n-type GaAs lasing region. Layer 4 is the p-type $Ga_{0.7}Al_{0.3}As$ laser region. Layer 5 is the n-type $Ga_{0.9}Al_{0.1}As$ base region. Layer 6 is the p-type $Ga_{0.7}Al_{0.3}As$ layer. A forward bias voltage V is placed across the entire structure by ohmic contacts 7, the voltage V being slightly less than the breakdown voltage of the back biased junction between layers 4 and 5. When light is supplied by light sources 8 or 9 and is absorbed in one of the two base regions (4 or 5), electron hole pairs will be generated which allow the device to switch into the current conducting state. That is, the reverse biased junction between layers 4 and 5 will become forward biased and holes will be injected from region 6 into the n-type GaAs region 3 resulting in laser emission from region 3.

The bandgap of the input light sensitive material must always be small enough to absorb the incident photons. Thus, if it is desired to have a repeater which emitted the same wavelength as the trigger light wavelength, the laser radiator active region should have more aluminum than the receiving region. For example, in FIG. 1 layer 5 would be n-type GaAs; and layer 3 would be $Ga_{0.95}Al_{0.05}As$, with the other layers remaining the same.

Figure 2:
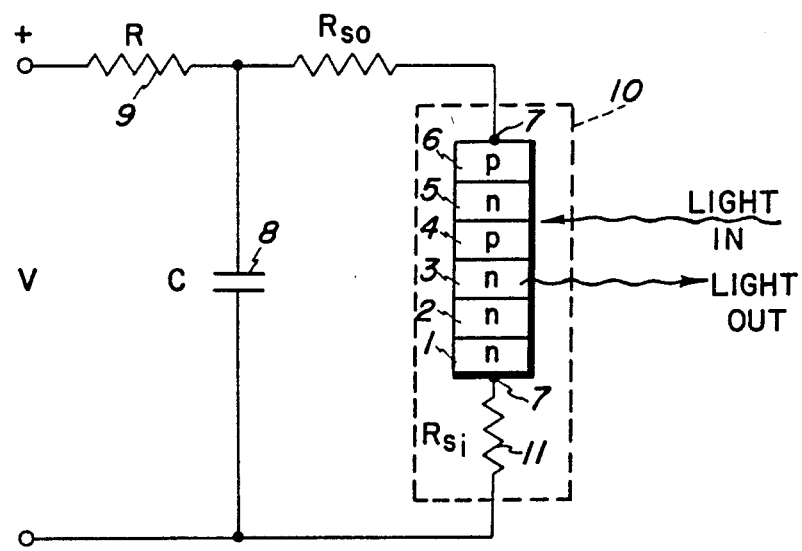

Referring now to FIG. 2, if a constant voltage V is applied to the structure 10, the current will be constant and will be determined by the series resistance 11 of the device 10 and the external circuit. The laser will continue to operate unless the current or voltage drops below the "holding" current or "holding" voltage for device 10. A drop in the holding current is achieved if the laser device 10 is biased as shown in FIG. 2. In this case the laser will emit a pulse of light the duration of which is dependent on the external circuit parameters. The on time of the laser pulse $T_1$ can be expressed as:

$$T_1 = R_s C \ln \frac{V}{I_{th} R_s}$$

where $I_{th}$ is the threshold lasing current; $R_s$ is the series resistance in the laser branch including the internal resistance of the laser 10, $R_{si}$, plus the external resistance $R_{so}$; C is the external capacitor value and V is the applied voltage.

Figure 3:
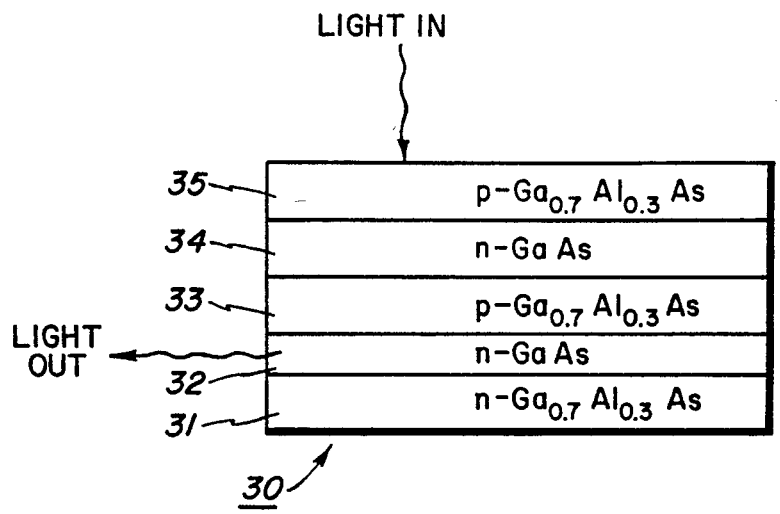
Figure 4:
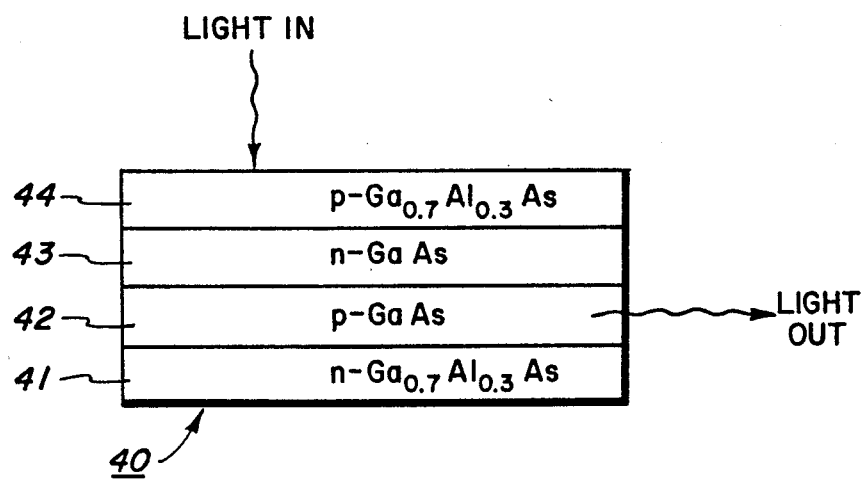

FIGS. 3 and 4 depict other configurations which operate in accordance with the principles of the present invention. FIG. 3, for example, discloses a laser device 30 wherein layer 31 is n-type $Ga_{0.7}Al_{0.3}As$; layer 32 is n-type GaAs; layer 33 is p-type $Ga_{0.7}Al_{0.3}As$; layer 34 is n-type GaAs; while layer 35 is p-type $Ga_{0.7}Al_{0.3}As$. When incoming light impinges on layer 35, the light will be emitted from layer 32. FIG. 4 discloses another device 40 within the principles of the present invention. In this device, layer 41 is n-type $Ga_{0.7}Al_{0.3}As$; layer 42 is p-type GaAs, layer 43 is n-type GaAs; while layer 44 is $Ga_{0.7}Al_{0.3}As$. When incoming light impinges on layer 44, the laser light outputs from layer 42.

There are other configurations that also work in accordance with the principles of the present invention. For example, an n-p-n-p device will function in the same manner. Also, variations in the aluminum (Al) content of any of the layers will not affect operations except that the lasing region should be a low bandgap region in the device and light must be absorbed in one of the two base regions to trigger the device. The light emitting layer might also be p-type in the device shown in FIG. 1 and could be moved to between layers 5 and 6. In this case, the trigger light pulse 8 would have to impinge on the bottom of the device so it would not be absorbed in the light emitting layer. The devices set forth in FIGS. 1 to 4 disclose improved integrated optical repeaters wherein light is amplified and repeated directly in the same crystal.

Figure 5:
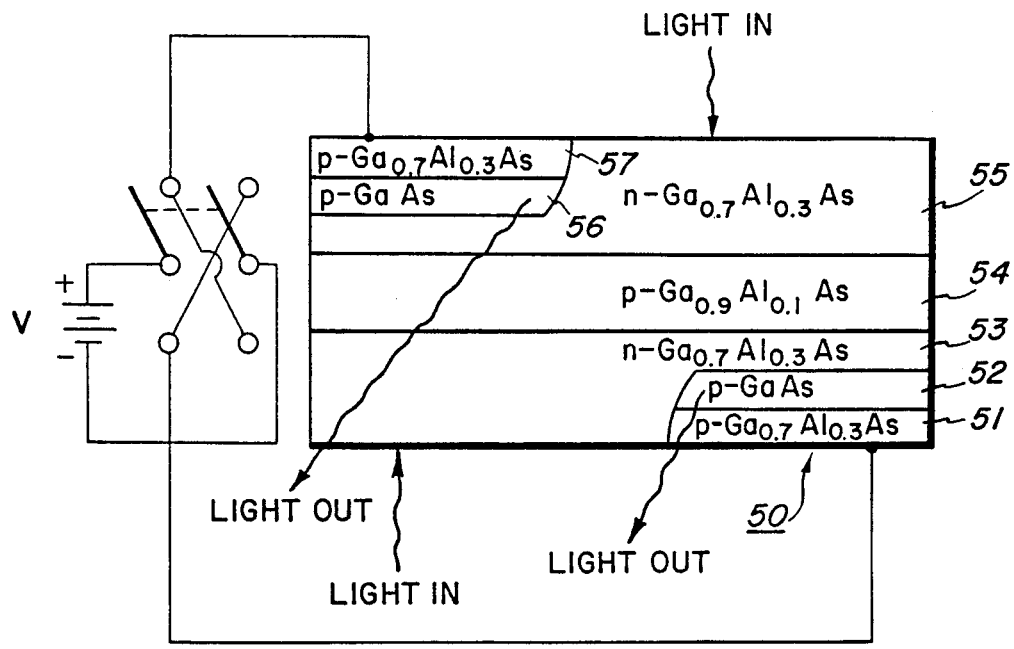
FIG. 5 is a schematic representation of a second embodiment of the present invention.

FIG. 5 discloses a bilateral p-n-p-n switch 50 which can emit these pulses with one of two spatially separated optical fibers depending on the polarity of the bias applied to the device. Thus it is not necessary to use an optical deflector to spatially scan the beam. In addition, device 50 is capable of determining which of two spatial locations (that is, of two input optical fibers) the input light pulse was emitted from.

Laser diode 50 in FIG. 5 is comprised of two p-n-p-n type switches, one of which is forward biased while the other is reverse biased. Layer 51 is p-type $Ga_{0.7}Al_{0.3}As$; layer 52 is p-type GaAs; layer 53 is a n-type $Ga_{0.7}Al_{0.3}As$; layer 54 is p-type $Ga_{0.9}Al_{0.1}As$; layer 55 is n-type $Ga_{0.7}Al_{0.3}As$; layer 56 is p-type GaAs; while layer 57 is $Ga_{0.7}Al_{0.3}As$. If light is absorbed in base layer 55 while the switch 58 is in the A position, the junction of layers 56 and 55 will be forwarded biased and the device will switch on and begin to lase with light emitted from layer 56. The junction of layers 52 and 53 will be back biased and no light will be emitted even if light is impinged on layer 53. When the switch 58 is thrown to the B position, the junction biases are reversed and light will be emitted from layer 52 but not layer 56. If an external RC circuit is provided for the device 50 in FIG. 5 similar to that shown in FIG. 2, the device 50 will emit a short pulse of light from either the layer 52 or 56 depending on the positions of switch 58. Thus, depending on the position of switch 58, light will be selectively emitted from layers 52 or 56 or selectively activated by light impinged on layer 53 or 55. If the second switch of the laser lases at a different wavelength than does the first one, frequency multiplexing into the same or different optical fibers can be achieved.

Figure 6:
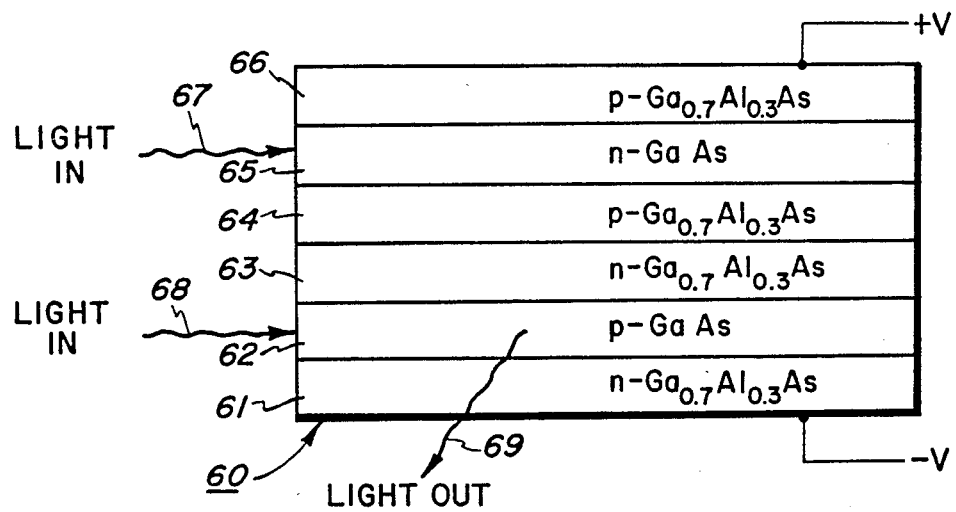
FIGS. 6 to 8 show schematic representations of alternate features of another embodiment of the present invention.

Extending the principle of the present invention wherein the laser device is impinged with two independent light sources, attention is now directed to FIG. 6. This figure describes a device 60 in which two simultaneous input light pulses 67 and 68 are used to stimulate the generation of a single output pulse 69. Such a device could function as a logic element in an integrated optical circuit or optical repeater circuit. As an alternative, the device in FIG. 6, and FIGS. 7 and 8 for that matter, could be utilized to produce a single output pulse upon simultaneous electrical inputs instead of the simultaneous input light pulses. Further, an amplified electrical current can similarly be generated.

FIG. 6 shows one such laser device 60. It consists of layers of six alternating conductivity types, i.e., p-n-p-n-p-n or n-p-n-p-n-p. Layer 61 is n-type $Ga_{0.7}Al_{0.3}As$; layer 62 is p-type GaAs; layer 63 is n-type $Ga_{0.7}Al_{0.3}As$; layer 64 is p-type $Ga_{0.7}Al_{0.3}As$; layer 65 is n-type GaAs, and layer 66 is p-type $Ga_{0.7}Al_{0.3}As$. There are two reverse biased junctions (64, 65 and 62, 63) when a forward bias V is applied across the device as shown in FIG. 6. Light sources 67 and 68 (and/or electrical contacts) are used to create minority carriers in the vicinity of the two back biased junctions. When device 60 is biased near the breakover voltage of the back biased junctions, injection of these minority carriers causes the device to switch into the current conducting state and the device begins to lase as shown as laser output 69. Thus, in operation as an optical AND function, both light sources 67 and 68 (or equivalent electrical source contacts) must be on at the same time to cause light output pulse 69 to be emitted.

The laser operation of the device 60 in FIG. 6 will continue until the voltage V across or the current through the device drops below the "holding" voltage or "holding" current. This aspect can be established by placing the device 60 in an RC circuit similar to the one shown and described in conjunction with FIG. 2. This circuit allows the pulse width of the amplified pulse to be varied by changing the resistor and capacitor values.

Figure 7:
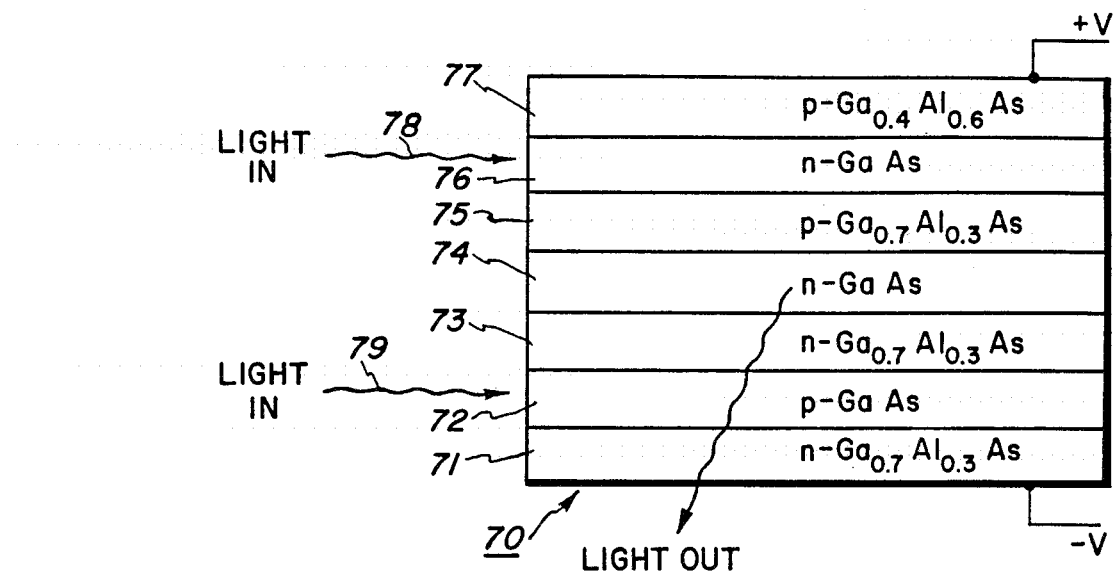

FIG. 7 shows an alternate device 70 for the optical AND function from that set forth in FIG. 6. Layer 71 is n-type $Ga_{0.7}Al_{0.3}As$; layer 72 is p-type GaAs; layer 73 is n-type $Ga_{0.7}Al_{0.3}As$; layer 74 is n-type GaAs; layer 75 is p-type $Ga_{0.7}Al_{0.3}As$; layer 76 is n-type GaAs; and layer 77 is p-type $Ga_{0.4}Al_{0.6}As$. Again, in order to produce light output 791, light inputs (or equivalent electrical source contacts) 78 and 79 must be present simultaneously to produce the optical AND function operation. While in FIG. 6, the light source 67 impinges on layer 65 and light source 68 impinges on layer 62 to produce the laser output 69 from layer 62; in FIG. 7, light source 78 impinges on layer 76 and light source 79 impinges on layer 72 to generate the laser light output 791 from layer 74.

Figure 8:
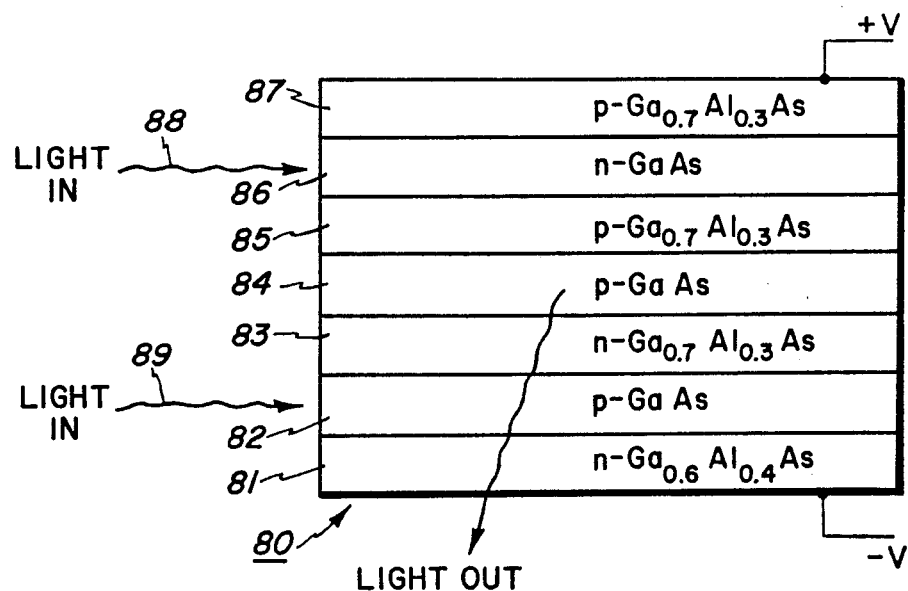

FIG. 8 shows another alternate device 80 for the optical AND function from that set forth in FIGS. 6 and 7. Layer 81 is n-type $Ga_{0.6}Al_{0.4}As$; layer 82 is p-type GaAs; layer 83 is n-type $Ga_{0.7}Al_{0.3}As$; layer 84 is p-type GaAs; layer 85 is p-type $Ga_{0.7}Al_{0.3}As$; layer 86 is n-type GaAs; and layer 87 is p-type $Ga_{0.7}Al_{0.3}As$. In order to produce laser light output 891, light inputs 88, 89 (or equivalent electrical source contacts) must be present simultaneously to produce the optical AND function. In FIG. 8, light output 891 emanates from layer 84 from light source 88 impinges on layer 86 and light source 89 impinges on layer 82.

The key criteria for operation of the laser devices shown and described in conjunction with FIGS. 6, 7, and 8, are: (1) the input light must have a wavelength such that it is absorbed in the region of the back biased junctions; (2) if laser output is desired, the lasing region must be surrounded by wider bandgap GaAlAs to achieve current and optical confinement; and (3) the lasing region should have a bandgap which is as low as or slightly lower than any other layer in the crystal so that good injection efficiency is obtained.

Figure 9:
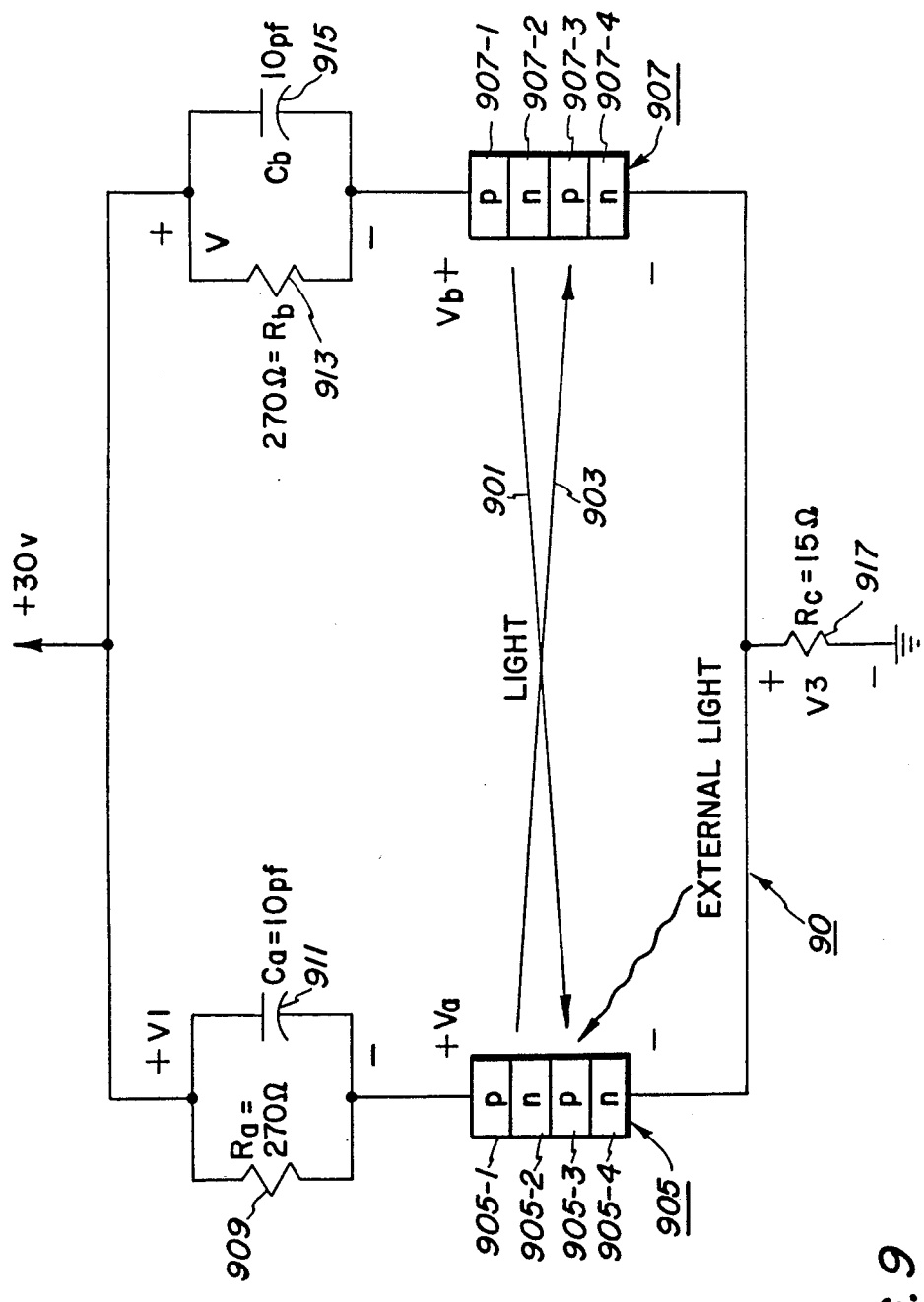
FIG. 9 is a schematic representation of still another embodiment of the present invention.

Extending the invention to another embodiment, FIG. 9 utilizes two diode lasers as set forth above, but now employed in an astable optical multivibrator configuration. The multivibrator 90 will generate two optical pulse trains 901, 903 which alternate. The repetition frequency is adjustable as seen below.

Both diode lasers 905 and 907 are p-n-p-n devices as set forth in FIG. 1, for example. Further, the circuit shown in FIG. 9 is connected to a +30 V supply and the components have the values shown, however, the electro-optic circuit is just an example, the circuit will function with other element values as well.

If neither laser 905, 907 is emitting light, the overall electro-optic circuit is quiescent, V1, V2, and V3 are all zero, and $V_a = V_b = 30$ V which is assumed to be below the breakdown voltage of the back biased junction 905-2/905-3 of laser 905 and 907-2/907-3 of laser 907. If a small amount of external light is now used to illuminate layer 905-3 or 907-3 (layer 905-3 in FIG. 9), the circuit 90 begins to function as follows. Diode laser 905 switches on and voltage Va drops to about 1.5 volts. Thus a very large current flows through capacitor 911, laser diode 905 and resistor 917. The voltage V3 is very large at this point, about 28.5 volts, but decays with a time constant of approximately $(R917)(C911) = 15 \times 10 \times 10^{-12} = 150 \times 10^{-12}$ seconds toward an equilibrium value of 1.5 volts. At that time V1 would be approximately 27 volts.

Throughout this time diode laser 905 is emitting light and a small amount of its output light 903 is allowed to impinge on layer 907-3. As capacitor 911 charges, V3 falls toward 1.5 volts and $V_b$, therefore, increases from an initial value of approximately 1.5 volts toward 28.5 volts. Before this latter voltage is achieved, however, the combination of light impinging on layer 907-3 and increasing voltage causes laser diode 907 to switch ON. At the instant this occurs, there is a surge of current through capacitor 915, laser diode 907 and resistor 917 which substantially increases voltage V3 and switches OFF laser diode 905. Now capacitor 911 discharges through resistor 909 with a time constant of $(R909)(C911) = 270 \times 10 \times 10^{-12} = 2.7 \times 10^{-9}$ seconds. Light 901 from laser diode 907 illuminates layer 905-3 and when voltage $V_a$ increases sufficiently, diode 905 switches ON and diode 907 switches OFF. This process repeats indefinitely until some event occurs to interrupt it, such as momentarily setting the power supply voltage to zero or removing the external light source.

The repetition frequency of the multivibrator action is adjustable by varying the component values; for example, resistor 909/capacitor 911 and/or resistor 913/capacitor 915. The pulses generated by laser diodes 905, 907 need not be equal in duration: (R909)(C911) can differ from (R913)(C915).

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention. For example, the lasers have been described with the percentages of gallium, aluminum and arsenide being $Ga_{0.7}Al_{0.3}As$. The lases will also operate in accordance with the principle of the invention with percentages between $Ga_{0.85}Al_{0.15}$ and $Ga_{0.4}Al_{0.6}$. Further, other semiconductive combinations may be utilized, such as, $Ga_{1-4}In_xAs_{1-y}P_y$.

What is claimed is:

1. An optical AND logic element comprising a plural layer semiconductor laser diode which is electrically biased to the point wherein light input causes the laser to commence lasing from an active semiconductor layer such that the improvement is characterized by:
    a crystalline structure (60) of intermixed layers of n and p type semiconductor material, the junction of two of said intermixed layers being forward biased at the application of an electrical bias,
    wherein when said electrical bias (V) is slightly less than the breakdown voltage of at least two back biased junctions in said crystalline structure and external light is supplied from at least two sources to said back biased junctions simultaneously, said back biased junctions becoming forward biased so as to stimulate the emission of laser light from said active semiconductor layer.

2. The diode laser as set forth in claim 1 wherein said crystalline structure of intermixed layers comprises:
    a first layer (61) of n-type $Ga_{0.7}Al_{0.3}As$,
    a second layer (62) of p-type GaAs,
    a third layer (63) of n-type $Ga_{0.7}Al_{0.3}As$,
    a fourth layer (64) of p-type $Ga_{0.7}Al_{0.3}As$,
    a fifth layer (65) of n-type GaAs, and
    a sixth layer (66) of p-type $Ga_{0.7}Al_{0.3}As$,
said back biased junctions being between the fourth (64) and fifth (65) layers and between the second (62) and third (63) layers, and light is emitted from the second (62) layer.

3. The diode laser as set forth in claim 1 wherein said crystalline structure of intermixed layers comprises:
    a first layer (71) of n-type $Ga_{0.7}Al_{0.3}As$,
    a second layer (72) of p-type of GaAs,
    a third layer (73) of n-type $Ga_{0.7}Al_{0.3}As$, a fourth layer (74) of n-type GaAs,
a fifth layer (75) of p-type Ga$_{0.7}$Al$_{0.3}$As,
a sixth layer (76) of n-type GaAs, and
a seventh layer (77) of p-type Ga$_{0.4}$Al$_{0.6}$As
said back biased juncions being between the second (72) and third (73) layers and between the fifth (75) and sixth (76) layers, and light is emitted from said fourth (74) layer.

4. The diode laser as set forth in claim 1 wherein said crystalline structure of intermixed layers comprises:
a first layer (81) of n-type Ga$_{0.6}$Al$_{0.4}$As,
a second layer (82) of p-type GaAs,
a third layer (83) of n-type Ga$_{0.7}$Al$_{0.3}$As,
a fourth layer (84) of p-type GaAs,
a fifth layer (85) of p-type Ga$_{0.7}$Al$_{0.3}$As,
a sixth layer (86) of n-type GaAs, and
a seventh layer (87) of p-type Ga$_{0.7}$Al$_{0.3}$As,
said back biased junctions being between the second (82) and third (83) layers and between the fifth (85) and sixth (86) layers, and light is emitted from said fourth (84) layer.

* * * * *